US010371573B2

(12) United States Patent
Hosking

(10) Patent No.: US 10,371,573 B2
(45) Date of Patent: Aug. 6, 2019

(54) ELECTROMAGNETIC POWER MEASUREMENT AND REPORTING

(71) Applicant: FINISAR CORPORATION, Sunnyvale, CA (US)

(72) Inventor: Lucy G. Hosking, Santa Cruz, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 918 days.

(21) Appl. No.: 14/594,869

(22) Filed: Jan. 12, 2015

(65) Prior Publication Data
US 2016/0202117 A1 Jul. 14, 2016

(51) Int. Cl.
G01J 1/44 (2006.01)
G01J 1/42 (2006.01)
G01J 1/18 (2006.01)
H03G 3/30 (2006.01)

(52) U.S. Cl.
CPC . G01J 1/44 (2013.01); G01J 1/18 (2013.01); G01J 1/4257 (2013.01); H03G 3/3084 (2013.01); *G01J 2001/444* (2013.01)

(58) Field of Classification Search
CPC .... G01J 1/44; G01J 1/18; G01J 1/4257; G01J 2001/444; H03G 3/3084
USPC .......................................................... 702/189
See application file for complete search history.

(56) References Cited

U.S. PATENT DOCUMENTS

| 7,053,806 | B1* | 5/2006 | Rao | H03M 1/1028 341/118 |
| 7,697,952 | B2* | 4/2010 | Larsen | H04L 43/08 455/11.1 |
| 2005/0058455 | A1* | 3/2005 | Aronson | H04B 10/07 398/135 |
| 2005/0123009 | A1* | 6/2005 | Caldwell | H01S 3/13 372/29.011 |
| 2012/0177368 | A1* | 7/2012 | Aoki | H04B 10/616 398/38 |
| 2017/0104464 | A1* | 4/2017 | Mohan | H01L 31/02019 |

* cited by examiner

Primary Examiner — Sujoy K Kundu
Assistant Examiner — Lynda Dinh
(74) Attorney, Agent, or Firm — Maschoff Brennan

(57) ABSTRACT

A method to measure and report electromagnetic radiation power includes receiving electromagnetic radiation and generating an electrical signal having a magnitude based on the power of the electromagnetic radiation. An adjustable gain may be applied to the electrical signal to generate an amplified electrical signal that may be sampled to generate a digital sample. The adjustable gain may be controlled based on the value of the digital sample and the digital sample may be associated with a gain value. One or more calibration factors may be selected based on the gain value associated with the digital sample and the selected calibration factor(s) may be used to calculate the power of the electromagnetic radiation.

20 Claims, 5 Drawing Sheets

ELECTROMAGNETIC POWER MEASUREMENT AND REPORTING

FIELD

The embodiments discussed herein are related to electromagnetic power measurement and reporting.

BACKGROUND

In communication systems, light beams are increasingly used for transmitting information. The demand for communication bandwidth has resulted in a conversion of long and short haul communication trunk lines from copper to fiber optic (digital) communication. The wide spectral characteristics of fiber optics support broadband signals at very high data rates, gigabits per second.

Generally, a fiber optic transmitter converts an electrical signal to a modulated light beam, which is then passed through an optical fiber to a fiber optic receiver that extracts an electrical signal from the received light beam. An optical fiber may be shared with different communication channels using frequency, time, wavelength, space, or other forms of multiplexing. A typical optical link extends the range of a communication system with a fiber optic transceiver unit that handles optoelectronic conversion between optical fibers and local area networks (LAN) on opposing ends of the fiber. Typical fiber optic transceivers include both a Receiver Optical Subassembly (ROSA) to receive light signals and a Transmitter Optical Subassembly to transmit light signals. Fiber optic transceivers offer gigabit communication rates over long haul trans-oceanic cables or short range links in a metropolitan area.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Some example embodiments generally relate to electromagnetic radiation power measurement.

In an example embodiment, a method may include receiving electromagnetic radiation and generating an electrical signal in response to the received electromagnetic radiation. The magnitude of the generated electrical signal may be based on the power of the electromagnetic radiation. The method may also include applying an adjustable gain to the electrical signal to generate an amplified electrical signal and sampling the amplified electrical signal to generate a digital sample of the amplified electrical signal. The method may further include controlling the adjustable gain applied to the electrical signal based on a value of the digital sample.

In another example embodiment, a system may include a photodiode configured to receive electromagnetic radiation and generate a first electrical signal in response to the received electromagnetic radiation. The magnitude of the first electrical signal may be based on the power of the electromagnetic radiation. The system may also include a circuit configured to generate a second electrical signal based on the magnitude of the first electrical signal and an adjustable gain amplifier configured to apply an adjustable gain to the second electrical signal to generate an amplified signal. The system may further include an analog-to-digital converter configured to sample the amplified signal and generate a digital sample. The system may additionally include a gain control module configured to control the adjustable gain applied to the second electrical signal based on a value of the digital sample.

In yet another example embodiment, a method may include receiving a digital sample indicative of power of electromagnetic radiation and receiving a gain value associated with the digital sample. The method may also include selecting one or more calibration factors based on the gain value associated with the digital sample and calculating the power of the electromagnetic radiation by applying the calibration factors to the digital sample.

In a further example embodiment, a system may include an adjustable gain amplifier with multiple gain values, or gain settings. The adjustable gain amplifier may be configured to amplify an electrical signal indicative of power of electromagnetic radiation and generate an amplified electrical signal based on a selected one of the multiple gain values. The system may also include an analog-to-digital converter configured to sample the amplified electrical signal and generate a digital sample. The system may further include a power calculation module communicatively coupled to the analog-to-digital converter. The power calculation module may be configured to select one or more calibration factors based on a gain value associated with the digital sample and calculate the power of the electromagnetic radiation by applying the selected calibration factor(s) to the digital sample.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description that follows or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

A more particular description of the invention will be rendered by reference to embodiments thereof, which are illustrated in the appended drawings. It is appreciated that these drawings depict only some embodiments of the invention and are therefore not to be considered limiting of its scope. The invention will be described and explained with additional specificity and detail through the use of the accompanying drawings in which.

DETAILED DESCRIPTION

Figure 1:
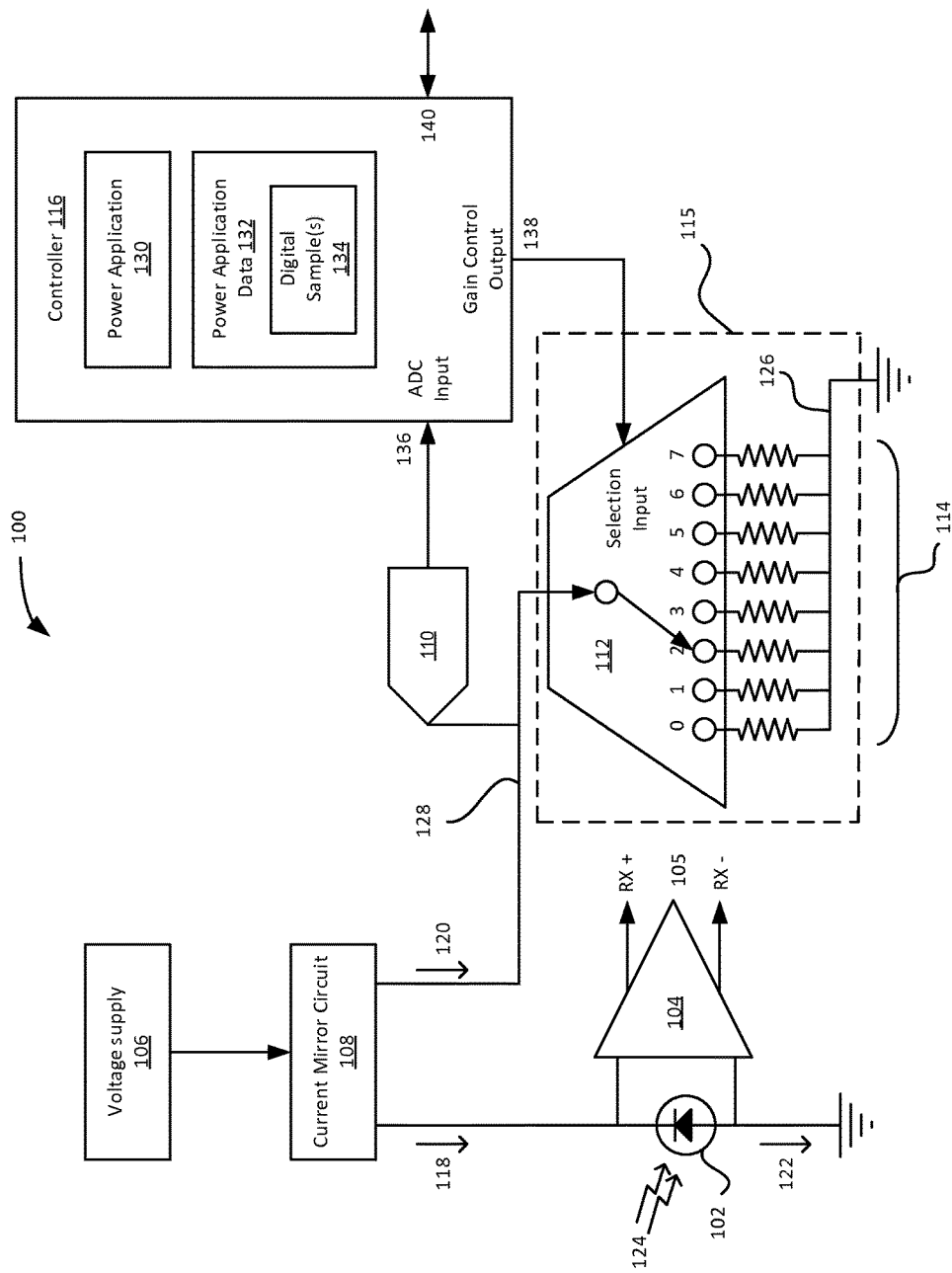
FIG. 1 illustrates an example electromagnetic radiation power measurement and reporting circuit.

This disclosure is generally drawn, inter alia, to methods, apparatus, systems, devices, and computer program products that generally relate to improved measurement and reporting of electromagnetic radiation power.

As an example, the systems and methods described herein may utilize adjustable gain amplifiers with a plurality of different gain values or settings to achieve improved resolution of electromagnetic radiation power measurements over a wider dynamic range of input power. The systems and methods described herein may also utilize different calibration factors for each gain value to improve the accuracy of power measurements.

A particular method described herein provides an improved scale for formatting and reporting power measurements. This improved method and scale provides greater resolution for reporting electromagnetic radiation power measurements over a wider dynamic range of input power.

Most fiber optic receivers are capable of measuring the power of electromagnetic radiation (e.g., light signals) they receive from optical transmitters. However, these receivers typically only provide an approximate measurement of power. For example, these receivers may have sufficient resolution and accuracy when measuring the power of relatively strong/intense light signals near the top end of their input power capabilities. However, the resolution and accuracy of these measurements is only good over a relatively small dynamic range of input power (e.g., 10 to 15 dB) near the top end of their input power capabilities.

These receivers lack the resolution and accuracy to measure the power of weaker, or less intense, light signals that fall within the middle and lower ranges of their input power capabilities. This limited power measurement capability may be sufficient and economical for many fiber optic systems. However, some optical fiber systems require receivers with better power measurement capabilities including increased resolution and accuracy over a wider dynamic range of power input. For example, high performance optical fiber receivers incorporating avalanche photodiodes have the ability to sense strong and weak light signals over a very wide dynamic range of input power (e.g., 20 to 30 dB).

Generally, photodiodes interact with electromagnetic radiation to create photocurrents that may indicate the intensities of electromagnetic radiation received by the photodiodes. In this manner, generated photocurrents may be used to calculate the power of electromagnetic radiation. However, avalanche photodiodes often have a non-linear relationship between received light intensities and the photocurrents generated in response thereto. Moreover, other circuit components may also introduce additional nonlinearities into generated photocurrent before they are measured. For example, some generated photocurrents may not be directly measured. Rather a mirrored current of the generated photocurrents generated by current mirror circuits may be measured to indirectly measure the generated photocurrents. In these and other circumstances, the current mirror circuits may create isolated mirror currents that are relatively proportional to the photocurrents generated by the photodiode. The current mirror circuits may also introduce additional nonlinearities into photocurrent measurements.

To help to compensate for nonlinearities in photocurrent measurements, among other reasons, the systems and methods described herein may utilize adjustable gain amplifiers with a plurality of different gain values or settings to achieve improved resolution of electromagnetic radiation power measurements over a wider dynamic range of input power. The systems and methods described herein may also utilize different calibration factors for each gain value to improve the accuracy of power measurements.

FIG. 1 illustrates an example electromagnetic radiation power measurement and reporting circuit 100 ("the circuit 100"), arranged in accordance with at least some embodiments disclosed herein. The circuit 100 may include, but is not limited to, a photodiode 102, a photocurrent amplifier 104, a voltage supply 106, a current mirror circuit 108, an analog-to-digital converter 110, an adjustable gain amplifier 115, which includes a selection multiplexer 112 and an array of gain control resistors 114, and a controller 116. The controller 116 may include a power application 130 and power application data 132, such as digital samples 134.

The components of the circuit 100 may be integrated together on a single semiconductor substrate (not shown). Alternately or additionally, one or more of the components of the circuit 100 may remain separate from other circuitry components. In some embodiments, the circuit 100 may be located within a single housing, such as a ROSA housing, a TOSA housing, or other fiber optic transceiver housing (not shown).

In some embodiments, the photocurrent 122 may be an electrical signal generated by the photodiode 102 that may be amplified by the photocurrent amplifier 104. In some embodiments, the photocurrent amplifier 104 may be a transimpedance amplifier (TIA) configured to amplify and convert the photocurrent 122 to a voltage, or any other suitable amplifier configured to amplify the photocurrent signal 122. The photocurrent amplifier 104 may amplify the photocurrent 122 and output data representing the photocurrent 104 on output pins RX+ and RX− 105. The data may be further amplified by a post-amplifier (not shown) and/or communicated to outside circuitry (not shown).

The photodiode 102 may include a P-N photodiode, a PIN photodiode, an avalanche photodiode, or any other suitable photodiode. In some embodiments, when the photodiode 102 is an avalanche photodiode, the voltage supply 106 may be configured to apply a reverse-bias voltage to the photodiode 102. Generally, if the reverse-bias voltage applied to an avalanche photodiode is increased, an avalanche breakdown will eventually occur at a characteristic avalanche voltage $V_A$. The avalanche voltage $V_A$ may range from about 40 volts to 200 volts and varies from one avalanche photodiode to another. The avalanche voltage $V_A$ may also vary as a function of the temperature of the avalanche photodiode. Generally, the sensitivity of an avalanche photodiode may be maximized when it is operated at a reverse-bias voltage $V_{APD}$ that is a little less than the avalanche voltage $V_A$. In some embodiments, the avalanche voltage $V_A$ may be about 1 volt or less.

The current mirror circuit 108 may be coupled between the voltage supply 106 and the photodiode 102. The current mirror circuit 108 may be configured to pass a reverse-bias current 118 to the photodiode 102 and produce a mirror current 120. The mirror current 120 may be provided as an input to the selection multiplexer 112. The mirror current 120 may be proportional to the sum of the reverse-bias current 118 and a photocurrent 122 generated by the photodiode 102 in response to the photodiode 102 receiving electromagnetic radiation 124. The photocurrent 122 generated by the photodiode 102 may be proportional to the power of the electromagnetic radiation 124 and may vary with time. Thus, the mirror current 120 may also vary in time in proportion to the power of the electromagnetic radiation 124.

In some embodiments, the current mirror circuit 108 may generate the mirror current 120 approximately proportional to the photocurrent 122 without regard to a load placed on an output of the current mirror circuit 108 that outputs the mirror current 120. For example, if the photocurrent 122 increases, the current mirror circuit 108 may proportionally increase the mirror current 120, regardless of the size of the load on the output of the current mirror circuit 108. Likewise, if the photocurrent 122 decreases, the current mirror circuit 108 may proportionally decrease the mirror current 120, regardless of the size of the load on the output of the current mirror circuit 108.

In some embodiments, the output of the current mirror circuit 108 that outputs the mirror current 120 may be coupled to and loaded by the adjustable gain amplifier 115. The adjustable gain amplifier 115 may be configured to adjust a voltage on a sample node 128 between the current mirror circuit 108 and the adjustable gain amplifier 115 based on the mirror current 120 and a gain of the adjustable gain amplifier 115. The magnitude of the voltage at the sample node 128 may represent the power of the electromagnetic radiation 124 received by the photodiode 102, which may vary based on the power of the electromagnetic radiation 124. The voltage at the sample node 128 may be sampled by the ADC 110 to measure the power of the electromagnetic radiation 124 received by the photodiode 102.

In some embodiments, the gain of the adjust gain amplifier 115 may be adjusted based on a gain control resistor selected from the array of gain control resistors 114 included in the adjustable gain amplifier 115. In these and other embodiments, the output of the current mirror circuit 108 may be loaded by a gain control resistor selected from the array of gain control resistors 114 included in the adjustable gain amplifier 115. FIG. 1 illustrates the array of gain control resistors 114 as including eight gain control resistors. However, any number of gain control resistors may be used without departing from the spirit or scope of the present disclosure. Each gain control resistor may have a first terminal coupled to a ground node 126 and a second terminal coupled to one of the nodes of the selection multiplexer 112. In this manner, the selection multiplexer 112 may be used to select a gain control resistor and direct the mirror current 120 through the selected gain control resistor to the ground node 126.

FIG. 1 illustrates the selection multiplexer 112 with node two selected. Node two of the selection multiplexer 112 may be connected to, or correspond to, resistor two (R2) in the array of gain control resistors 114. In the illustrated example, the array of gain control resistors 114 includes eight resistors, which may be numbered according to the selection multiplexer node to which they are coupled (e.g., R0, R1, R2, R3, R4, R5, R6, and R7).

Each gain control resistor may have a different resistance value. In one embodiment, the gain control resistors include resistance values that approximately double in size for each resistor moving from R0 to R7. In some embodiments, the resistance value of the gain control resistors may represent a gain applied by the adjustable gain amplifier 115 to the current mirror signal 120. Thus, in these and other embodiments, the corresponding gain values corresponding to each of the gain control resistors may also approximately double in size for each resistor moving from R0 to R7. For example, the gain control resistors may have values of: R0≈500Ω; R1≈1 KΩ; R2≈2.5 KΩ; R3≈5 KΩ; R4≈10 KΩ; R5≈25 KΩ; R6≈50 KΩ; and R7≈100 KΩ. Thus, the gain control resistors may provide a sequence of gains that are approximately: 1, 2, 4, 8, 16, 32, 64, and 128. As a result, each gain step is approximately a factor of two that corresponds to increments of approximately 3 dBm of gain for the voltage at the sample node 128.

The gain of the adjustable gain amplifier 115 applied to the voltage at the sample node 128 may be based on the adjustable gain amplifier 115 and independent of the mirror current 120 because the current mirror circuit 108 may generate the same or substantially the same mirror current 120 regardless of the selected gain control resistor. For example, if the mirror current 120 is 1 mA, and the selection multiplexer 112 is set to select R0≈500Ω, then the voltage at the sample node 128 will be ≈0.5 volts, according to Ohms law V=IR. However, if the selection multiplexer 112 is set to select R1≈1 K9Ω (instead of R0≈500Ω), this would not substantially affect the magnitude of the value of the mirror current 120 but the resulting voltage at the sample node 128 would be ≈1 volt. Thus, in this example, selecting R1 instead of R0 effectively amplifies the voltage at the sample node 128 by a factor of two. Likewise, the voltage at the sample node 128 based on the mirror current 120 may be amplified with a different factor, or gain value, for each gain control resistor in the array of gain control resistors 114.

The analog-to-digital converter (ADC) 110 may be coupled to the sample node 128 and configured to sample the voltage at the sample node 128 created by the mirror current 120 passing through one of the gain control resistors. The ADC 110 may convert the analog voltage at sample node 128 into one or more digital samples 134 with digital values. The digital samples 134 may be sent to the controller 116 for calibration to standard units (such as or millivolts, or microwatts) and/or storage in predefined memory locations, as will be discussed in more detail below. In at least some embodiments, the ADC 110 may be controlled by a clock signal to periodically sample the voltage at the sample node 128 and create an array of digital samples 134 based on the clock signal. The ADC 110 may also include an automatic prescaler (not shown), or other electronic counting circuit to reduce high frequency signals to a lower frequency through integer division.

In some embodiments, the ADC 110 may have 10-bit resolution. However, ADC's with other resolution levels may also be used in other embodiments without departing from the spirit or scope of the present disclosure. The dynamic range of electromagnetic radiation power measurements may be limited by the resolution of the ADC 110. For example, a 10-bit ADC has 1024 counts (ranging from count 0 to count 1023). Typically, the maximum overall gain value for the mirror current 120 is selected so that the expected maximum photocurrent 122 does not cause the mirror current 120 (and thereby the voltage at sample node 128 resulting from the photocurrent 122) to overload the ADC 110. For example, if the ADC 110 overload occurs at about 2 mW (≈+3 dBm), then the ADC 110 will be near its maximum at approximately 1023 counts. At −17 dBm (20 dBm below+3 dBm), the ADC 110 will be at approximately 102 counts, which represents ≈1% resolution per count. At −27 dBm (30 dBm below+3 dBm), the ADC 110 will be at approximately 10 counts, and the resolution will deteriorate to ≈10% per count. Accordingly, in this example the theoretical useful dynamic range of electromagnetic radiation power measurements utilizing a 10-bit ADC is about 20 dBm. Moreover, non-linearity introduced by the photodiode 102, the current mirror circuit 108, the ADC 110, and/or other circuit components may further limit the useful dynamic range of electromagnetic radiation power measurements to a practical range of about 15 dBm near the upper range of electromagnetic radiation power measurements.

Accordingly, an adjustable gain amplifier, such as the one shown in FIG. 1, may be implemented to compensate for reduced resolution and dynamic range caused by the ADC 110, thereby achieving a high-resolution power measurement system over a wide dynamic range. The adjustable gain amplifier 115 may also be located at or near the photocurrent signal 122 in order to preserve the signal-to-noise ratio of the photocurrent signal 122. Additionally, implementing an adjustable gain amplifier may also enable electromagnetic radiation power measurement systems with different calibration factors for each gain value to better compensate for non-linear distortions and increase the accuracy of power measurements. For example, the adjustable gain amplifier 115 shown in FIG. 1 has eight different gain settings/values and each gain setting may be associated with its own set of calibration factors, as will be discussed in more detail below.

The controller 116 may be configured to receive digital samples 134 from the ADC 110 at an ADC input 136. The controller 116 may include a power application 130 configured to control the gain setting/value of the adjustable gain amplifier 115 (based on the digital samples 134) and adjust the gain of the adjustable gain amplifier 115 through a gain control output 138. The power application 130 may also calibrate the digital samples 134 to standard units (such as or millivolts, or microwatts) and/or store the digital samples 134 in predefined memory locations. The power application 130 may also calculate electromagnetic radiation power measurements and communicate the power measurements through a communication interface 140, such as an I²C interface, or any other suitable interface.

Figure 2:
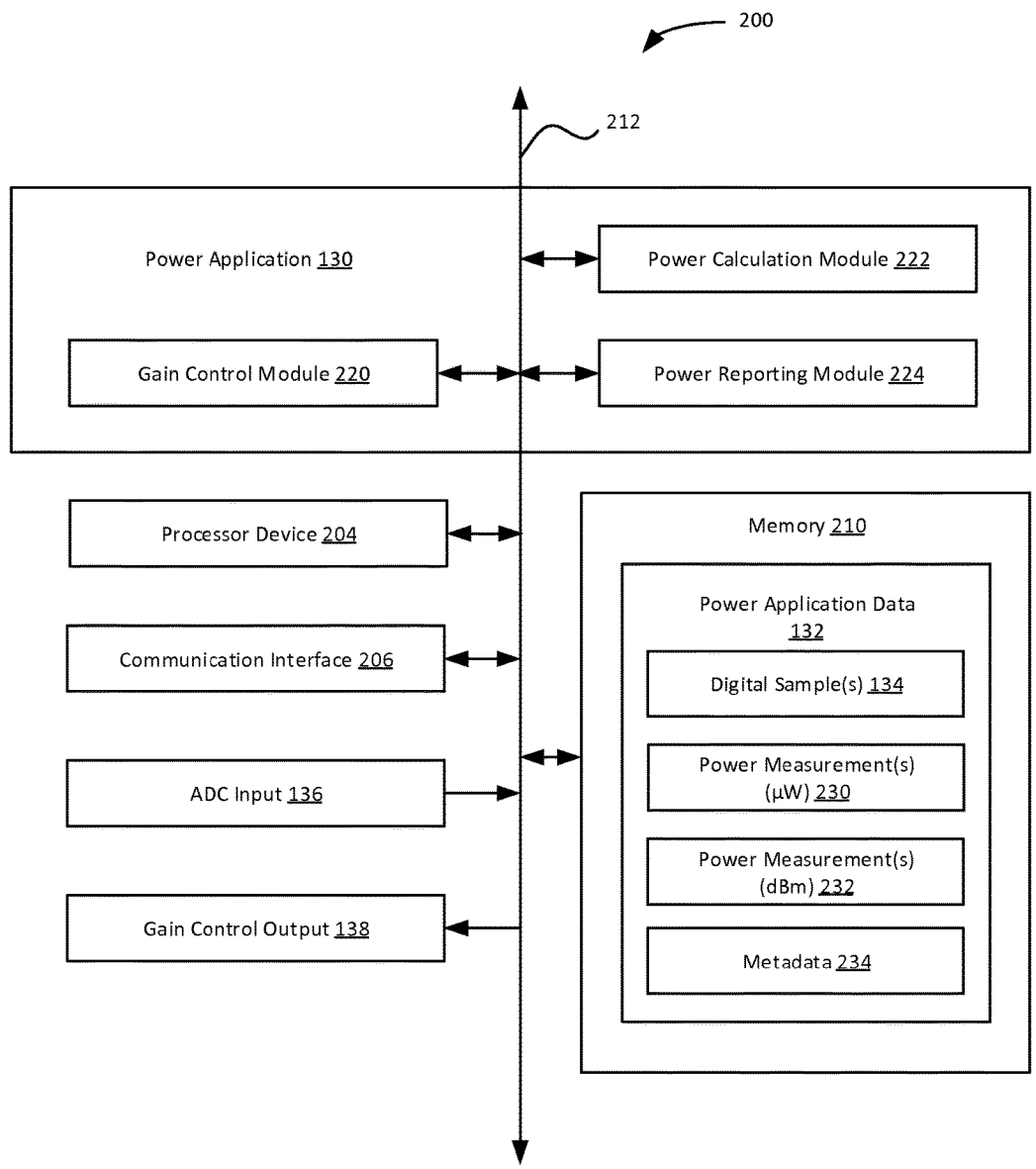
FIG. 2 is a block diagram illustrating an example controller system that may be used in the electromagnetic power measurement and reporting circuit of FIG. 1.

FIG. 2 is a block diagram illustrating an example controller system 200, arranged in accordance with at least one implementation described herein. The controller system 200 may correspond to the controller 116 of FIG. 1 and may be implemented as a single integrated circuit on a semiconductor substrate. The controller system 200 may include a power application 130, a processor device 204, a communication interface 206, a memory 210, an ADC input 136, and a gain control output 138, according to some examples.

The power application 130 may include at least one of a gain control module 220, a power calculation module 222, or a power reporting module 224, collectively referred to herein as "modules." The power application 130, including the modules, may generally include software that includes programming code and/or computer-readable instructions executable by the processor device 204 to perform or control performance of the functions and operations described herein. The power application 130, including one or more of the modules, may receive data from another one of the components of the controller system 200 and may store the data in the memory 210.

The components of the controller system 200 may be communicatively coupled to each other by a bus 212. The bus 212 may include, but is not limited to, a memory bus, a bus/interface controller, an interface bus, or the like, or any combination thereof.

The communication interface 206 may be configured to transmit and receive data to and from other devices (not shown) through a network bus, such as an I²C serial computer bus, a universal asynchronous receiver/transmitter (UART) based network bus, or any other suitable network bus. In some implementations, the communication interface 206 may include a wireless transceiver for exchanging data with other devices or other communication channels using one or more wireless communication methods, including IEEE 802.11, IEEE 802.16, BLUETOOTH®, Wi-Fi, Zigbee, NFC, or another suitable wireless communication method.

The processor device 204 may include an arithmetic logic unit, a microprocessor, a general-purpose controller, or some other processor or array of processors, to perform or control performance of operations as described herein. The processor device 204 may be configured to process data signals and may include various computing architectures including a complex instruction set computer (CISC) architecture, a reduced instruction set computer (RISC) architecture, or an architecture implementing a combination of instruction sets. Although FIG. 2 includes a single processor device 204, multiple processor devices may be included and other processors and physical configurations may be possible. The processor device 204 may be configured to process any suitable number format including, but not limited to two's complement numbers, integers, fixed-point binary numbers, and/or floating point numbers, all of which may be signed or unsigned.

Figure 3:
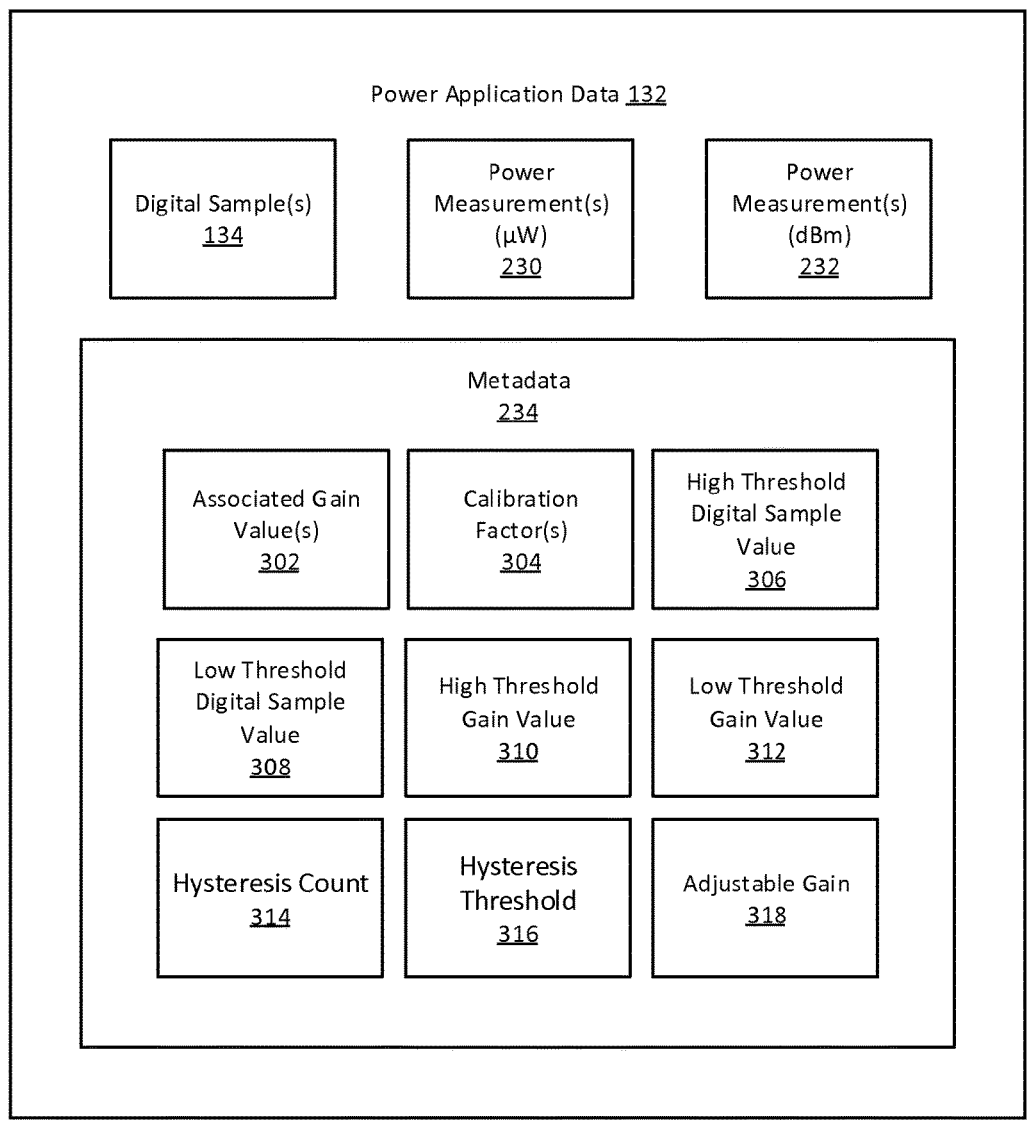
FIG. 3 is a block diagram illustrating an example power application data that may be included in the controller system of FIG. 2.

The memory 210 may include a non-transitory storage medium that stores instructions or data that may be executed or operated on by the processor device 204. The instructions or data may include programming code that may be executed by the processor device 204 to perform or control performance of the operations described herein. The memory 210 may include volatile memory, such as a dynamic random access memory (DRAM) device, a static random access memory (SRAM) device, or the like. In some implementations, the memory 210 may also include a non-volatile memory or similar permanent storage media including a flash memory device, an EEPROM, a magnetic memory device, an optical memory device, or some other mass storage for storing information on a more permanent basis. The memory 210 may store power application data 132, such as digital samples 134, power measurements expressed in microwatts 230, power measurements expressed in dBm 232, and metadata 234 that may be used by one or more of the modules. FIG. 3 illustrates the power application data 132 of FIGS. 1 and 2 in more detail. The metadata 234 may include associated gain values 302, calibration factors 304, a high threshold digital sample value 306, a low threshold digital sample value 308, a high threshold gain value 310, a low threshold gain value 312, a hysteresis count 314, a hysteresis threshold 316, and an adjustable gain 318. The adjustable gain 318 may represent the current gain setting or current gain value of an adjustable gain amplifier.

With combined reference to FIGS. 1-3, the gain control module 220 may receive digital samples 134 from the ADC 110 through the ADC input 136 and/or access the digital samples 134 stored in memory 210. The gain control module 220 may generally be configured to control the gain of the adjustable gain amplifier 115 through the gain control output 138, based on the values of the digital samples 134 the gain control module 220 receives. The gain control module 220 may be configured to continually adjust the gain of the adjustable gain amplifier 115 such that the voltage at the sample node 128 remains within a relatively narrow range defined by the ADC's 110 particular resolution zone, such as an optimal resolution zone of the ADC 110. For example, a typical ADC may have better resolution for sample values that lie between 40% and 90% of the ADC's full scale range. Assuming a 10-bit ADC, the full scale range of the ADC would be 0 to 1023. Thus, 40% of full scale would be ≈409 and 90% of full scale would be ≈920. In this example, the high threshold digital sample value 306 may be assigned a value of 920 and the low threshold digital sample value 308 may be assigned a value of 409. The gain control module 220 may be configured to compare the value of the digital sample 134 to the high threshold digital sample value 306. If the value of the digital sample 134 is greater than the high threshold digital sample value 306, the gain control module 220 may lower the adjustable gain 318 of the adjustable gain amplifier 115 (in this example, by a factor of approximately 2) to bring the voltage at the sample node 128 back down into the particular resolution zone of the ADC 110. On the other hand, if the value of the digital sample 134 is less than the low threshold digital sample value 308, the gain control module 220 may increase the adjustable gain 318 of the adjustable gain amplifier 115 (in this example, by a factor of approximately 2) to bring the voltage at the sample node 128 back up into the particular resolution zone of the ADC 110.

In at least some embodiments, the gain control module 220 may also utilize a high threshold gain value 310 and/or a low threshold gain value 312 to decide whether to increase or decrease the adjustable gain 318 of the adjustable gain amplifier. For example, the adjustable gain amplifier 115 of FIG. 1 has eight allowable gain settings (e.g., gain settings zero through seven corresponding to gain control resistors R0-R7). As one non-limiting example, it may be determined through calibration testing that the high threshold gain value 310 for a particular electromagnetic radiation power measurement circuit 100 should be six (corresponding to R6), and the low threshold gain value 312 should be one, (corresponding to R1). Accordingly, the high threshold gain value 310 may be assigned a value of six and the low threshold gain value 312 may be assigned a value of one. In this example, the gain control module 220 may compare the value of the digital sample 134 to the high threshold digital sample value 306. If the value of the digital sample 134 is greater than the high threshold digital sample value 306, the gain control module 220 will want to lower the adjustable gain 318 of the adjustable gain amplifier 115 to bring the voltage at the sample node 128 back down into a particular resolution zone of the ADC 110. However, if the adjustable gain 318 is already set at six (corresponding to R6), and the high threshold gain value 310 is six, then the gain control module 220 will not adjust the gain setting up to seven (corresponding to R7). Likewise, if the value of the digital 134 is less than the low threshold digital sample value 308, the gain control module 220 will want to increase the adjustable gain 318 to bring the voltage at the sample node 128 back up into the particular resolution zone of the ADC 110. However, if the adjustable gain 318 is already set to one (corresponding to R0), and the low threshold gain value 312 is one, then the gain control module 220 will not adjust the gain setting to zero (corresponding to R0).

In some embodiments, the gain control module 220 may also utilize hysteresis delays to prevent repeated switching of the adjustable gain 318 due to noise in the mirror current signal 120. In this manner, the gain control module 220 may utilize a hysteresis count 314 and a hysteresis threshold 316 to create an appropriate time delay before deciding whether to adjust the adjustable gain 318.

As one non-limiting example, the hysteresis threshold 316 may be chosen to be ten and the hysteresis count 314 may be initially set to zero. The gain control module 220 may receive digital sample 134 with a value that is less than the low threshold digital sample value 308. In some embodiments, this condition may cause the gain control module 220 to increase the adjustable gain 318. However, in some embodiments that use the hysteresis count 314, the gain control module 220 may be configured to delay the decision to increase the adjustable gain 318 until the gain control module 220 receives a particular number of consecutive digital samples 134 (e.g., ten) with values below the low threshold digital sample value 308.

In these and other embodiments, each time the gain control module 220 receives a digital sample 134 with a value that is less than the low threshold digital sample value 308, the gain control module 220 may increment the hysteresis count 314. When the hysteresis count 314 is equal to or greater than the hysteresis threshold 316, the gain control module 220 may increase the gain and reset the hysteresis count to zero.

In some embodiments, the gain control module 220 may receive a digital sample 134 with a value that exceeds the high threshold digital sample value 306. In some embodiments, this condition may cause the gain control module 220 to lower the adjustable gain 318. However, in some embodiments that use the hysteresis count 314, the gain control module 220 may be configured to delay the decision to lower the adjustable gain 318 until the gain control module 220 receives a particular number of consecutive digital samples 134 with values above the high threshold digital sample value 306. In these and other embodiments, each time the gain control module 220 receives a digital sample 134 with a value that exceeds the high threshold digital sample value 306, the gain control module 220 may increment the hysteresis count 314. When the hysteresis count 314 is equal to or greater than the hysteresis threshold 316, the gain control module 220 may decrease the adjustable gain 318 and reset the hysteresis count to zero. Thus, the gain control module 220 may avoid repeatedly changing the adjustable gain 318 due to noise present in the mirror current signal 120. Although the above example utilizes a hysteresis threshold 316 value of ten, it will be understood that the hysteresis threshold 316 may have any other value without departing from the spirit or scope of the present disclosure.

The power calculation module 222 may generally be configured to calibrate and calculate power measurements based on values of the digital sample 134 and their associated gain values 302. The power calculation module 222, or other module, may be configured to identify a value of the adjustable gain 318 that is set when a digital sample is created by the ADC 110.

The power calculation module 222 may be configured to associate the identified gain value 302 with the digital sample 134 and/or store the digital sample 134 in memory 210 with its associated gain value 302. For example, FIG. 1 illustrates an adjustable gain amplifier 115 with a gain value of "two" selected. Accordingly, the power calculation module 222 may store a digital sample 134 in memory with its associated gain value 302 of two.

Each associated gain value 302 may be associated with its own corresponding set of calibration factors 304. In at least some implementations, the calibration factors 304 for each associated gain value 302 may be linear calibration factors including a slope term and an offset term. Each associated gain value 302 may be calibrated during the production process and linear slope and offset terms for each associated gain value 302 may be determined and stored in the memory 210 as calibration factors 304. However, it will be understood that other calibration factors 304 may be used including, but not limited to, n order polynomial, exponential, logarithmic, table lookup, or any other calibration factors or calibration math may be used. Any of these calibration factors 304 may be stored in memory 210 in any numerical form, including, but not limited to, integers, fixed-point binary numbers, floating point numbers, two's complement numbers, etc., all of which may include signed or unsigned number formatting.

In some embodiments, two or more sets of calibration factors 304 may be used. For example, in some embodiments one set of calibration factors 304 may be used to create power measurements expressed in microwatts and another set of calibration factors 304 may be used to create power measurements expressed in dBm. In other embodiments, a single set of calibration factors 304 may be used to create power measurements expressed in microwatts, which may then be converted to power measurements expressed in dBm.

As one non-limiting example, the electromagnetic radiation power measurement and reporting circuit 100 shown in FIG. 1 may have linear calibration factors 304 including a slope term and an offset term for each of the eight available gain settings provided by the adjustable gain amplifier 115. Thus, an array of eight slope terms and offset terms may be associated with the eight available gain settings. The appropriate calibration factors 304 may be selected from this array of calibration factors 304 (based on the associated gain value 302 of a digital sample 134) and the selected calibration factors 304 may be applied to the digital sample 134. For example, if the digital sample 134 has an associated gain value 302 of two, the power calculation module 222 may select the slope term and offset term corresponding to an associated gain value 302 of two and apply these terms to the digital sample 134 to calibrate and calculate the power associated with the digital sample 134. An example equation for this process may be: (digital sample*slope term[2])+offset term [2]=power. If the digital sample 134 has an associated gain value 302 of three, then the equation would be: (digital sample*slope term[3])+offset term [3]=power. This equation may generally be written as: (digital sample*slope term[n])+offset term [n]=power, where "n" is the associated gain value 302 of the particular digital sample 134. Although the above example utilizes an adjustable gain amplifier 115 with eight discrete gain values corresponding to eight linear calibration factors, it will be understood that any number of discrete gain values may be used, as well as any type of calibration factors, without departing from the spirit or scope of the present disclosure.

Each discrete gain value corresponds to a small range of input power, effectively dividing the full range of power input in a piece-wise fashion among each discrete gain value. In this manner, any deviations from linear may be minimized even though the overall relationship between the power and the photocurrent 122 may be highly nonlinear over the full range of power input. In general, as the number of gain settings/values increase, deviations from linear in the power measurements will decrease. Accordingly, power measurements utilizing the systems and methods disclosed herein may be highly calibrated and linearized with increased resolution and accuracy over a wide range of power input.

In at least some implementations described herein, the linear calibration factors may be selected such that the bottom of a gain setting range equates to the top of the next lower gain setting range and the top of a gain setting range equates to the bottom of the next higher gain setting range. This may result in a smooth transition from one gain setting range to the next without discontinuities between different gain setting ranges. Moreover, a two point linear calibration at the bottom and top of each gain setting range will produce the greatest accuracy at the end points of each gain setting range with little or no discontinuity between adjacent gain ranges. Thus, the upper and lower points of each gain setting's calibration factors may be selected so that they correspond to the same power at the low end of the next gain step above, and the high end of the next gain step below. Any measurement deviations from this linear calibration may be greatest in the middle of each range, but since each gain setting range may be made small by increasing the number of gain settings, each gain setting range may be accurately calibrated within itself.

Although the above examples utilize adjustable gain amplifiers with discrete gain settings, it will be understood that adjustable gain amplifiers with continuous gain settings may also be used. In these embodiments, the gain setting of continuously adjustable gain amplifiers (not shown) may be converted into a digital number that may be used to derive calibration factors 304 tailored to the particular gain setting. The digital number may be used with any mathematical process to derive calibration factors 304 including, but not limited to, linear, $n^{th}$ order polynomial, exponential, and logarithmic mathematical processes. Alternatively, or in addition thereto, the digital numbers may be used to as an index number in conjunction with one or more lookup tables comprising predefined calibration factors 304.

The power reporting module 224 may generally be configured to format and report power measurements. In some embodiments, the power reporting module 224 may format and report power measurements 230 in units of microwatts. In these and other embodiments, the power reporting module 224 may format and report power measurements in units of microwatts 230 on a standard scale using a 16-bit unsigned binary number. This 16-bit unsigned binary number may have a range corresponding from 0 to 6.5535 mW with an incremental value (or least significant bit value) of 0.1 microwatts per count. This standard scale is usually sufficient for power measurement circuits utilizing PIN photodiodes with typical power detection capabilities ranging from 0 dBm down to about −20 dBm. However, power measurement circuits utilizing avalanche photodiodes may have power detection capabilities ranging from 0 dBm down to −40 dBm and lower. A −40 dBm signal corresponds to a power of 0.1 microwatts, or a single count on the standard scale. Likewise, a −37 dBm signal corresponds to a count of two on the standard scale, offering only 3 dBm of incremental resolution. A signal below −40 dBm may not be represented with the standard scale because any signal below 0.1 microwatts automatically represents a count of zero on the standard scale.

Accordingly, in some embodiments the power reporting module 224 may be configured to format and report power measurements in units of dBm 232 with an improved scale. In a particular embodiment, the power reporting module 224 may format and report power measurements 232 in units of dBm using a 16-bit, signed, fixed-point binary number in two's complement format. The 16-bit, signed, fixed-point binary number may have with a range of ≈−128.000 dBm to ≈=128.000 dBm with a fractional resolution of $\frac{1}{256}$ or 0.00391 dBm per count. The most significant bit of the 16-bit number may represent the sign of the dBm value, which may be zero for positive dBm values and one for negative dBm values. The next seven most significant bits of the 16-bit number may correspond to the integer portion of the dBm value to the left of the decimal point and may range from 0 to 128. The eight least significant bits of the 16-bit number may correspond to the fractional portion of the dBm value to the right of the decimal point and may range from ≈0.000 to 0.996 dBm. This improved scale and reporting method may represent power measurements below −40 dBm, which may not be represented on the standard scale.

In some embodiments, the power reporting module 224 may be configured to include one or more format indication flags (not shown) to indicate which format, scale, and/or reporting method the power reporting module 224 is configured to utilize. In one example, the one or more indication flags may comprise one, two, or more bits of a binary number configured to indicate which format, scale, and/or reporting method in which the power reporting module 224 is operating. In some embodiments, the power reporting module 224 may include sufficient circuitry and software to simultaneously perform power measurement formatting and reporting in both the standard scale and the improved scale. In these and other embodiments, the one or more indication flags may not be necessary.

Figure 4:
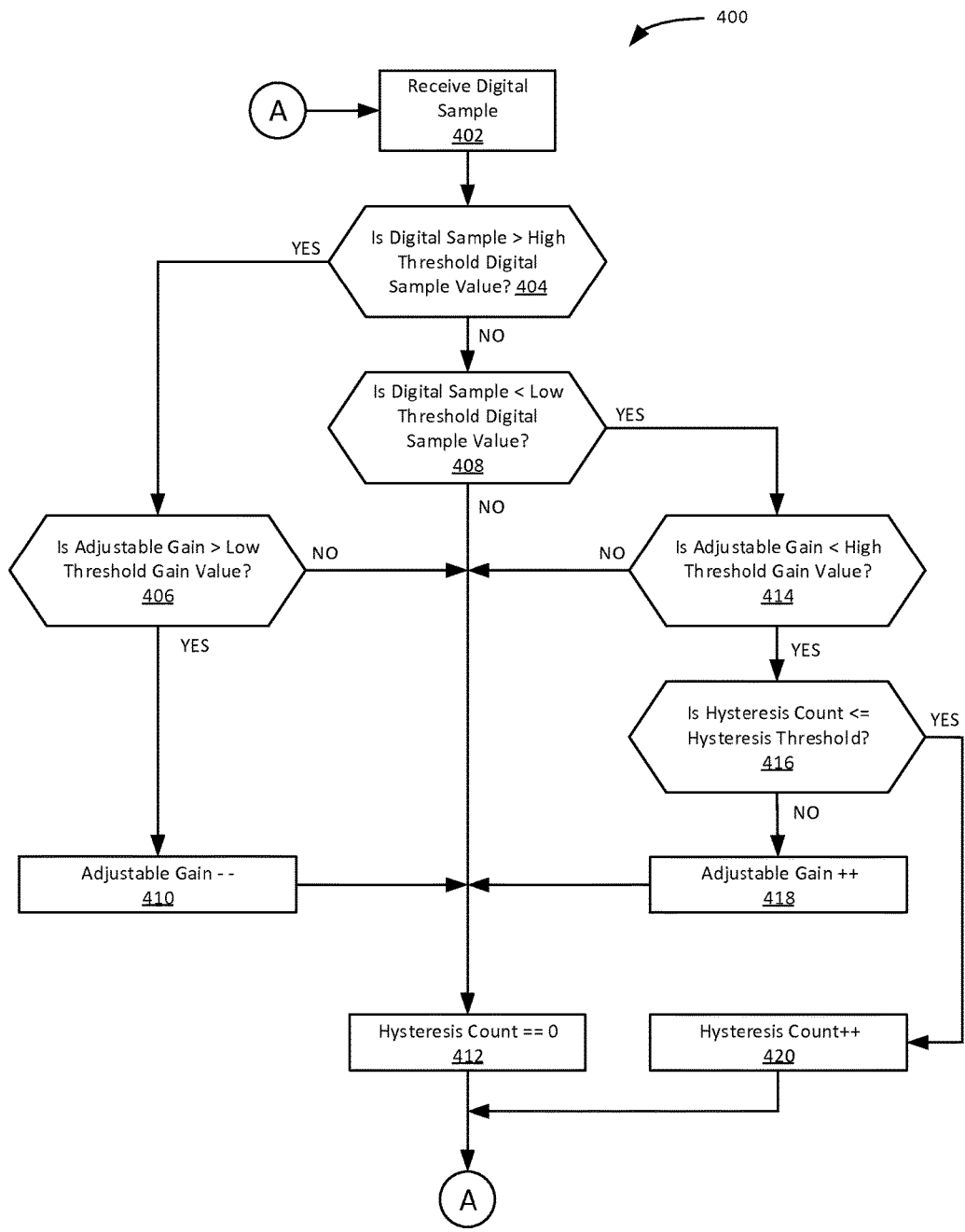
FIG. 4 is a flow diagram of an example method to control the gain of an adjustable gain amplifier that may be implemented by the controller system of FIG. 2.

FIG. 4 is a flow diagram of an example method 400 to control the gain of an adjustable gain amplifier, arranged in accordance with at least one implementation described herein. The method 400 may be implemented, in whole or in part, by one or more of the controller 116 of FIG. 1, the controller system 200 of FIG. 2, or another suitable device and/or system. The method 400 may begin at block 402 and the method 400 may continuously repeat as indicated by the two circular block's "A" in FIG. 4.

In block 402 ("Receive Digital Sample"), a digital sample 134 may be received for analysis. The digital sample 134 may be a digital number relating to power of electromagnetic radiation. Block 402 may be followed by block 404.

In block 404 ("Is Digital Sample>High Threshold Digital Sample Value?"), the digital sample 134 may be analyzed to determine whether the value of the digital sample 134 is greater than the high threshold digital sample value 306. The high threshold digital sample value 306 may be selected based on the particular resolution zone of the particular analog-to-digital converter used to create the digital sample 134, or any other design preferences. For example, the high threshold digital sample value 306 may be selected to be a digital value representing 90% of the sample range of the analog-to-digital converter used to create the digital sample 134.

Following block 404, the method 400 may branch depending on the value of the digital sample 134. If it is determined that the digital sample 134 is not greater than the high threshold digital sample value 306 ("No" at block 404 in FIG. 4), the method 400 may proceed to block 408. If it is determined that the digital sample 134 is greater than the high threshold digital sample value 306 ("Yes" at block 404 in FIG. 4), the method 400 may proceed to block 406.

In block 406 ("Is Adjustable Gain>Low Threshold Gain Value?"), the current adjustable gain 318 may be analyzed to determine whether it is greater than the low threshold gain value 312. The low threshold gain value 312 may be selected based on design preferences, specific circuit parameters, and/or unique power measurement requirements. In at least some examples, the low threshold gain value 312 may represent the lowest possible adjustable gain 318 of the particular adjustable gain amplifier that is utilized.

Following block 406, the method 400 may branch depending on the value of the adjustable gain 318. If it is determined that the adjustable gain 318 is greater than the low threshold gain value 312 ("Yes" at block 406 in FIG. 4), the method 400 may proceed to block 410. If it is determined that the adjustable gain 318 is not greater than the low threshold gain value 312 ("No" at block 406 in FIG. 4), the method 400 may proceed to block 412.

In block 412 ("Hysteresis Count==0"), the hysteresis count 314 may be reset to zero and the method 400 may repeat as indicated by the two circular block's "A" in FIG. 4.

In block 410 ("Adjustable Gain−−"), the adjustable gain 318 may be decreased. In some embodiments, the adjustable gain 318 may be incrementally decreased to the next lowest gain setting of the adjustable gain amplifier. The adjustable gain 318 may be updated to indicate that the gain of the adjustable gain amplifier has changed to the next lowest possible gain setting. For example, if the adjustable gain 318 has a value of three and the gain setting is incrementally decreased to the value of two, then the adjustable gain 318 may also be updated to a value of two to indicate the current gain setting of the adjustable gain amplifier. Block 410 may be followed by block 412 where the hysteresis count 314 may be reset to zero and the method 400 may repeat.

In block 408 ("Is Digital Sample<Low Threshold Digital Sample Value?"), the digital sample 134 may be analyzed to determine whether it is less than the low threshold digital sample value 308. The low threshold digital sample value 308 may be selected based on the particular resolution zone of the analog-to-digital converter used to create the digital sample 134, or any other design preferences. For example, the low threshold digital sample value 308 may be selected to be a digital value representing 40% of the sample range of the analog-to-digital converter used to create the digital sample 134.

Following block 408, the method 400 may branch depending on the value of the digital sample 134. If it is determined that the digital sample 134 is less than the low threshold digital sample value 308 ("Yes" at block 408 FIG. 4), the method 400 may proceed to block 414. If it is determined that the digital sample 134 is not less than the low threshold digital sample value 308 ("No" at block 408 in FIG. 4), the method 400 may proceed to block 412 where the hysteresis count 314 may be reset to zero and the method 400 may repeat.

In block 414 ("Is Adjustable Gain<High Threshold Gain Value?"), the adjustable gain 318 may be analyzed to determine whether it is less than the high threshold gain value 310. For example, the high threshold gain value 310 may be selected based on design preferences, specific circuit parameters, and/or unique power measurement requirements. In at least some examples, the high threshold gain value 310 may represent the highest possible gain setting of the particular adjustable gain amplifier that is utilized.

Following block 414, the method 400 may branch depending on the value of the adjustable gain 318. If it is determined that the adjustable gain 318 is less than the high threshold gain value 310 ("Yes" at block 414 in FIG. 4), the method 400 may proceed to block 416. If it is determined that the adjustable gain 318 is not less than the high threshold gain value 310 ("No" at block 414 in FIG. 4) the method may proceed to block 412 where the hysteresis count 314 may be reset to zero and the method 400 may repeat.

In block 416 ("Is Hysteresis Count<=Hysteresis Threshold?"), the hysteresis count 314 may be analyzed to determine whether it is less than or equal to a hysteresis threshold 316. The hysteresis threshold 316 may represent the number of consecutive digital samples 134 (with values below the low threshold digital sample value (308)) that must be detected before the adjustable gain 318 may be increased.

This may prevent repeatedly adjusting the adjustable gain 318 due to noise present in the signal.

Following block 416, the method 400 may branch depending on the value of the hysteresis count 314. If it is determined that the hysteresis count is less than or equal to the hysteresis threshold ("Yes" at block 416 in FIG. 4), the method may proceed to block 420. In block 420 ("Hysteresis Count++"), the hysteresis count 314 may be incremented and the method 400 may repeat. If it is determined that the hysteresis count 314 is not less than or equal to the hysteresis threshold 316 ("No" at block 416 in FIG. 4), the method may proceed to block 418.

In block 418 ("Adjustable Gain++"), the adjustable gain 318 may be increased. In at least some implementations described herein, the gain setting of the adjustable gain amplifier may be incrementally increased from the current gain setting 318 of the adjustable gain amplifier to the next highest possible gain setting of the adjustable gain amplifier. The adjustable gain 318 may be updated to indicate that the gain has changed to the next highest possible gain setting. For example, if the adjustable gain 318 has a value of three and the gain setting is incrementally increased to a value of four, then the adjustable gain 318 may also be updated to a value of four. Block 418 may be followed by block 412 where the hysteresis count 314 may be reset to zero and the method 400 may repeat.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed implementations.

Figure 5A:
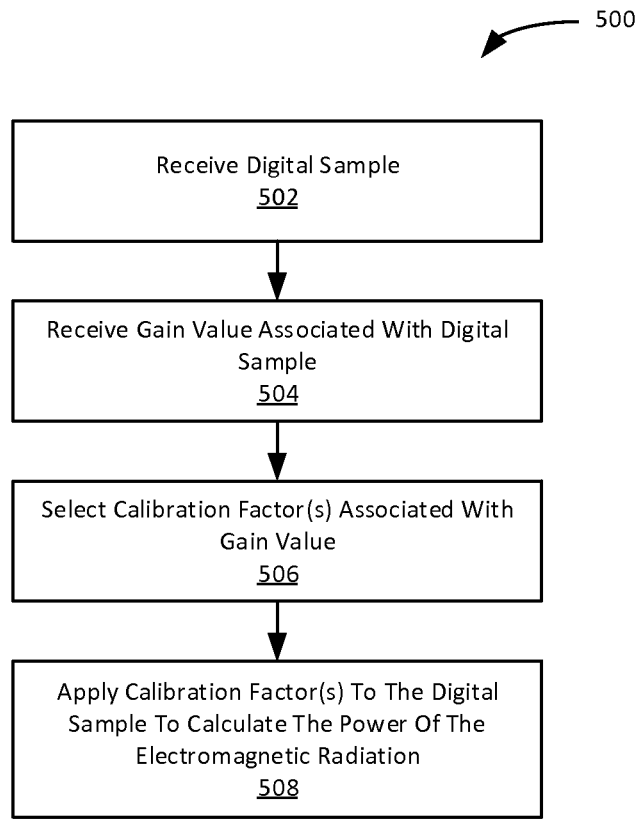
FIG. 5A is a flow diagram of an example method to calculate the optical power of a light signal that may be implemented by the controller system of FIG. 2.

FIG. 5A is a flow diagram of an example method 500 to calculate the optical power of a light signal, arranged in accordance with at least one implementation described herein. The method 500 may be implemented, in whole or in part, by one or more of the controller 116 of FIG. 1, the controller system 200 of FIG. 2, or another suitable device and/or system. The method 500 may begin at block 502.

In block 502 ("Receive Digital Sample"), a digital sample may be received and used to calculate the power of electromagnetic radiation. The digital sample may be a digital number representing a measurement associated with the power of electromagnetic radiation. Block 502 may be followed by block 504.

In block 504 ("Receive Gain Value Associated With Digital Sample"), an associated gain value may be received and used to calculate the power of electromagnetic radiation. The associated gain value may represent the selected gain value at the time a digital sample was created by an analog-to-digital converter. Block 504 may be followed by block 506.

In block 506 ("Select Calibration Factor(s) Associated With Gain Value"), the associated gain value for the digital sample may be used to select the appropriate calibration factors for application to the digital sample. Each gain value may be associated with its own unique calibration factors. Block 506 may be followed by block 508.

In block 508 ("Apply Calibration Factor(s) To The Digital Sample To Calculate The Power Of The Electromagnetic Radiation"), the appropriate calibration factors may be applied to the digital sample in order to calculate the power of the electromagnetic radiation.

Figure 5B:
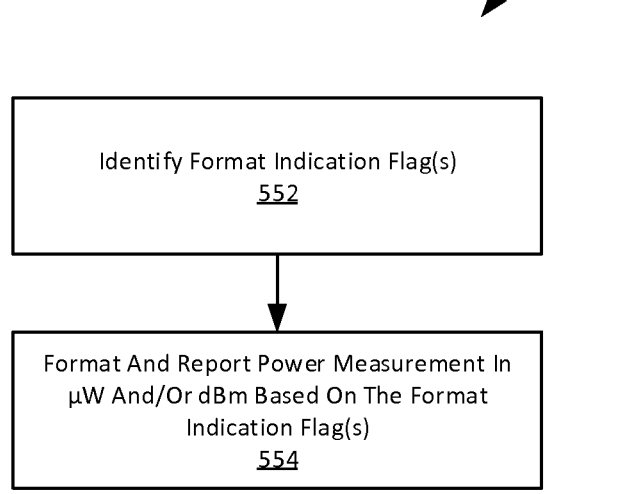
FIG. 5B is a flow diagram of an example method to format and report optical power measurements that may be implemented by the controller system of FIG. 2.

FIG. 5B is a flow diagram of an example method 550 to format and report power measurements, arranged in accordance with at least one implementation described herein. The method 550 may be implemented, in whole or in part, by one or more of the controller 116 of FIG. 1, the controller system 200 of FIG. 2, or another suitable device and/or system. The method 550 may begin at block 552.

In block 552 ("Identify Format Indication Flag(s)"), one or more format indication flags (not shown) may be identified. The one or more format indication flags may indicate which format, scale, and/or reporting method should be used to format and report the power measurements. Block 552 may be followed by block 554.

In block 554, power measurements may be formatted and reported based on the identified format indication flag(s). For example, power measurements may be formatted and reported in units of microwatts on a standard scale using a 16-bit unsigned binary number. This 16-bit, unsigned binary number may have a range corresponding from 0 to 6.5535 mW with an incremental value (or least significant bit value) of 0.1 microwatts per count. Alternatively, or in addition thereto, power measurements may be formatted and reported in units of dBm on an improved scale using a 16-bit, signed, fixed -point binary number in two's complement format. This 16-bit, signed, fixed-point binary number may have a range of ≈−128.000 dBm to z+128.000 dBm with a fractional resolution of 1/256 or ≈0.00391 dBm per count.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

The implementations described herein may include the use of a special purpose or general-purpose computer including various computer hardware or software modules, as discussed in greater detail below.

Embodiments within the scope of the technology disclosed herein may also include computer-readable media for carrying or having computer-executable instructions or data structures stored thereon. Such computer-readable media may be any available media that may be accessed by a general purpose or special purpose computer. By way of example, and not limitation, such computer-readable media may comprise RAM, ROM, EEPROM, CD-ROM or other optical disk storage, magnetic disk storage or other magnetic storage devices, or any other non-transitory medium which may be used to carry or store desired program code means in the form of computer-executable instructions or data structures and which may be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above may also be included within the scope of computer-readable media.

Computer-executable instructions comprise, for example, instructions and data, which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" may refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" will be interpreted as "including but not limited to," the term "having" will be interpreted as "having at least," the term "includes" will be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases will not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" will be interpreted to mean "at least one" or "one or more"); the same holds true for the use of definite articles used to introduce claim recitations. In addition, even if a specific number of an introduced claim recitation is explicitly recited, those skilled in the art will recognize that such recitation will be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, will be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range may be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to," "at least," and the like include the number recited and refer to ranges, which may be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

The present disclosure is not to be limited in terms of the particular embodiments described herein, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds, compositions, or biological systems, which may, of course, vary. It is also to be understood that the terminology used herein is for the purpose of describing particular embodiments only, and is not intended to be limiting. Accordingly, the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed is:

1. A method to be performed by a receiver optical subassembly for accurately reporting dynamic electromagnetic-radiation power measurements with high resolution, comprising:
   receiving, at a photodiode, a light signal from an optical transmitter, the light signal representative of information;
   generating, at the photodiode, an electrical signal based on the received light signal;
   amplifying, at an adjustable gain amplifier, the electrical signal based on a magnitude of the electrical signal and a resolution zone of an analog to digital converter;

storing a plurality of gain values corresponding to the amplification of the electrical signal;

generating, at an analog to digital converter, a plurality of digital samples based on the amplified electrical signal, each digital sample of the plurality of digital samples associated with a gain value of the plurality of the gain values;

selecting, at a power calculation module coupled to the analog to digital converter, one or more calibration factors for each gain value of the plurality of gain values;

calculating, at the power calculation module coupled to the analog to digital converter, the power of the electromagnetic radiation by applying the one or more calibration factors to the plurality of digital samples;

formatting, at a power reporting module, the power in units of Decibel-milliwatts (dBm) utilizing a 16-bit scale that ranges from approximately +128.000 dBm to −128.000 dBm with a resolution of $1/256$ dBm per count; and reporting the formatted power using the 16-bit scale for greater reporting resolution.

2. The method of claim 1, wherein the one or more calibration factors vary according to a value associated with a gain value of the plurality of gain values.

3. The method of claim 2, wherein the each gain value of the plurality of gain values is a continuous gain value and the continuous gain value is converted to a digital value.

4. The method of claim 1, wherein the one or more calibration factors comprises at least one of a slope term and an offset term.

5. The method of claim 4, wherein the one or more calibration factors comprises an array of slope terms associated with an array of offset terms.

6. The method of claim 5, wherein the one or more calibration factors comprises an array of eight slope terms associated with an array of eight offset terms.

7. The method of claim 1, wherein the one or more calibration factors comprises at least one of an exponential function, a polynomial function, or a logarithmic function.

8. The method of claim 1, wherein the one or more calibration factors are arranged in a look-up table.

9. The method of claim 1, wherein the power is formatted and reported in units of microwatts.

10. The method of claim 1, wherein reporting the formatted power comprises using a 16-bit, signed, fixed-point binary number in two's complement format.

11. The method of claim 1, wherein reporting the formatted power comprises storing the formatted power in a predefined memory location.

12. The method of claim 1, wherein reporting the formatted power comprises communicating the formatted power through a communication interface.

13. An optical fiber communication system for accurately reporting dynamic electromagnetic-radiation power measurements with high resolution, comprising:

a photodiode configured to receive a light signal from an optical transmitter, the light signal representative of information, the photodiode configured to generate an electrical signal based on the received light signal;

an adjustable gain amplifier having a plurality of amplification gain values and configured to amplify the electrical signal to generate an amplified electrical signal based on a selected amplification gain value of the plurality of amplification gain values; an analog-to-digital converter configured to sample the amplified electrical signal and generate a plurality of digital samples; and a power calculation module communicatively coupled to the analog-to-digital converter, the power calculation module configured to:

select one or more calibration factors for each calculation gain value of a plurality of calculation gain values, each digital sample of the plurality of digital samples associated with a calculation gain value of the plurality of calculation gain values; and calculate the power of the electromagnetic radiation by applying the selected one or more calibration factors to the plurality of digital samples; and a power reporting module configured to format the power in units of Decibel-milliwatts (dBm) utilizing a 16-bit scale that ranges from approximately +128.000 dBm to −128.000 dBm with a resolution of $1/256$ dBm per count for greater reporting resolution.

14. The system of claim 13, wherein the one or more calibration factors varies according to a calculation gain value of the plurality of calculation gain values.

15. The system of claim 13, wherein the one or more calibration factors comprises an array of slope terms associated with an array of offset terms.

16. The system of claim 15, wherein the one or more calibration factors comprises an array of eight slope terms associated with an array of eight offset terms.

17. The system of claim 13, wherein the one or more calibration factors comprises at least one of an exponential function, a polynomial function, and a logarithmic function.

18. The system of claim 13, wherein the one or more calibration factors are arranged in a look up table.

19. The system of claim 13, further comprising a power reporting module configured to format and report the power in units of microwatts on a scale.

20. The system of claim 13, further comprising a receiver optical subassembly, wherein each of the adjustable gain amplifier, the analog-to-digital converter, the a power calculation module, and the a power reporting module are included in the receiver optical subassembly.

* * * * *